United States Patent [19]

Roth

[11] Patent Number: 4,845,446

[45] Date of Patent: Jul. 4, 1989

[54] DYNAMICALLY VARIABLE ATTENUATOR

[75] Inventor: Stephen A. Roth, Aumsville, Oreg.

[73] Assignee: II Morrow, Inc., Salem, Oreg.

[21] Appl. No.: 945,216

[22] Filed: Dec. 19, 1986

Related U.S. Application Data

[63] Continuation of Ser. No. 722,813, Apr. 12, 1985, abandoned.

[51] Int. Cl.$^4$ ............................................. H03H 11/24
[52] U.S. Cl. ................................. 333/81 R; 307/255;
307/567; 307/540
[58] Field of Search ......................... 333/81 R, 81 A;
307/255, 540, 549, 550, 565–568

[56] References Cited

U.S. PATENT DOCUMENTS

| | | | |
|---|---|---|---|
| 3,031,588 | 4/1962 | Hilsenrath | 307/255 X |
| 3,077,545 | 2/1963 | Rywak | 307/255 X |
| 3,464,036 | 8/1969 | Robinson et al. | 333/17 RX |
| 3,465,171 | 9/1969 | Moses | 307/567 |
| 3,502,903 | 3/1970 | Wade | 333/81 RX |
| 3,515,906 | 6/1970 | Geller | 307/255 |
| 3,529,266 | 9/1970 | King | 333/81 R |
| 3,588,539 | 6/1971 | Vincentini et al. | 307/255 X |
| 3,614,472 | 6/1971 | Kloppenborg | 307/255 |
| 4,442,325 | 4/1984 | McDermott | 333/81 AX |
| 4,611,135 | 9/1986 | Nakayama et al. | 333/81 RX |

FOREIGN PATENT DOCUMENTS

| | | | |
|---|---|---|---|
| 2240235 | 2/1974 | Fed. Rep. of Germany | 307/255 |
| 75968 | 6/1977 | Japan | 307/255 |
| 0008452 | 1/1979 | Japan | 307/255 |
| 102124 | 8/1981 | Japan | 307/255 |

OTHER PUBLICATIONS

Cottrell, P. E., et al; "Complementary Bipolar Switch using Symmetrical Transistors"; *IBM Technical Disclosure Bulletin;* vol. 25, No. 2, Jul. 1982; pp. 538-539.

Cravrilyuk, S. A. "Manual Broad Band Power Alternator of RF Signals", *Instrument and Exp. Tech* (USA), No. 5, Sept.-Oct. 1970, p. 393.

*Primary Examiner*—Eugene R. Laroche
*Assistant Examiner*—Benny T. Lee
*Attorney, Agent, or Firm*—Dellett, Smith-Hill and Bedell

[57] ABSTRACT

A variable attenuator comprises a plurality of attenuator stages connected in series along a transmission line signal path. Each attenuator stage comprises a resstive pi-section attenuating pad which may be selectively inserted into the signal path to increase attenuation along the path. Each series element of the pad is selectively inserted or removed from the signal path by opening or closing a parallel connected switching device, while each shunt element of the pad is selectively connected to or disconnected from ground by closing or opening a corresponding series connected switching device. The switching devices each comprise an NPN bipolar transistor and a PNP bipolar transistor, the emitter of each transistor being coupled to the emitter of the other and the collector or each transistor being connected to the collector of the other, to provide a low impedance AC signal path from collector to emitter when the transistors are active.

4 Claims, 2 Drawing Sheets

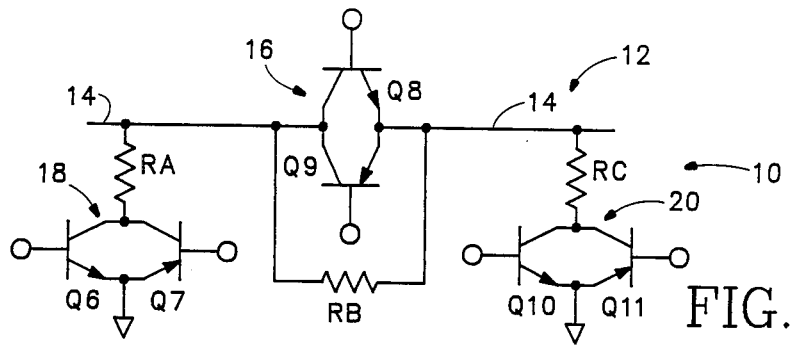
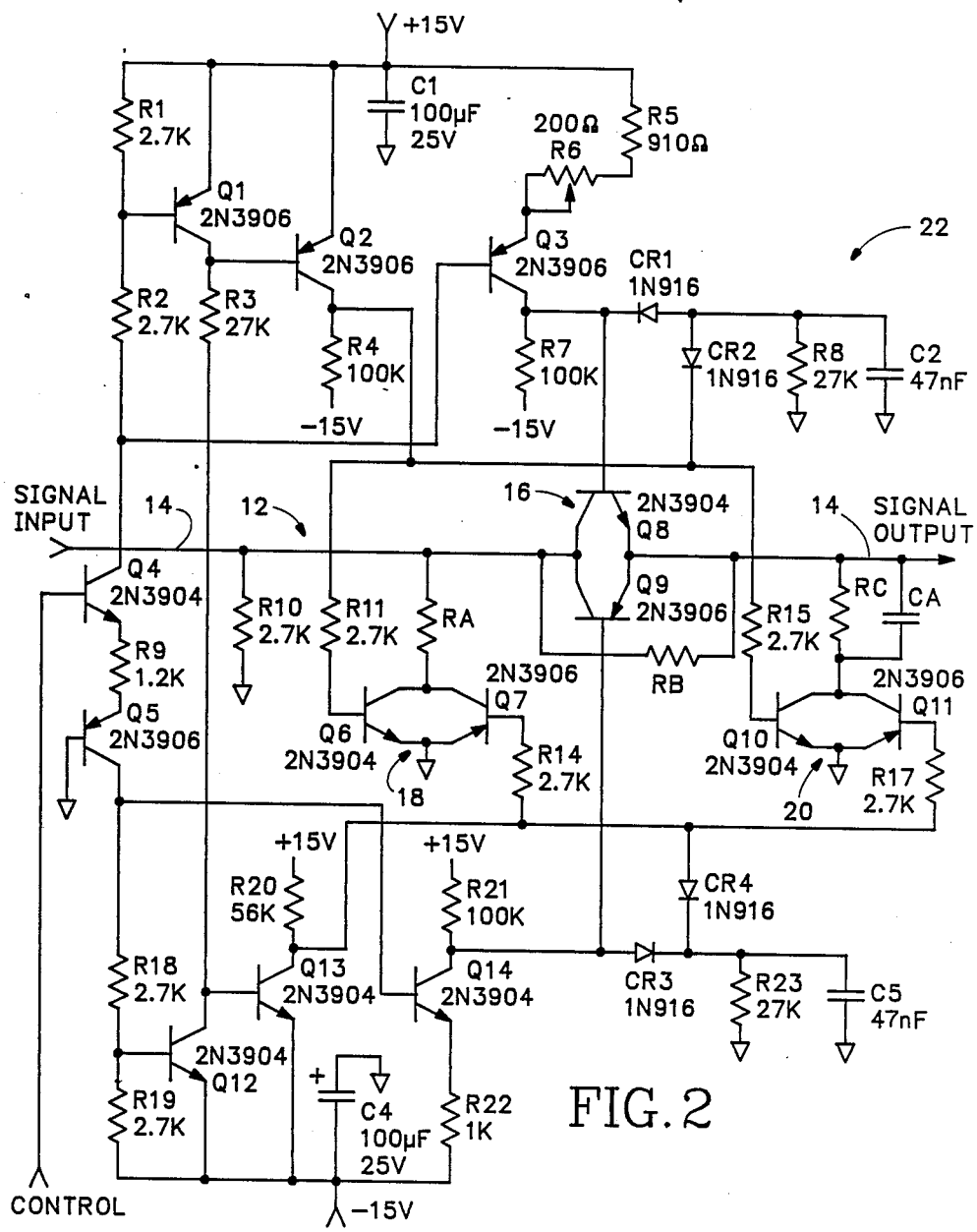
FIG. 1
FIG. 2

DYNAMICALLY VARIABLE ATTENUATOR

This is a continuation of application Ser. No. 722,813 filed Apr. 12, 1985 and now abandoned.

BACKGROUND OF THE INVENTION

The present invention relates to signal attenuators and in particular to a multi-stage variable signal attenuator.

Loran receivers determine the position of ships at sea or aircraft by comparing the timing of signals generated by two synchronized transmitters spaced some distance apart. To test and calibrate a Loran receiver, it is useful to simulate the transmissions of the two transmitters by applying two such signals to the receiver, varying the relative timing of the signals and checking the resulting position data produced by the receiver. In simulating the transmissions of the two transmitters, it would be useful to vary the signal strength of either signal to simulate the differences in distance to the transmitters from the receiver. However attenuators typically comprise transmission lines which delay or distort a signal by at least a small amount and the delay or distortion of one signal by even a small amount can cause a large error in the apparent position data generated by a Loran receiver.

SUMMARY OF THE INVENTION

According to one aspect of the invention, a dynamically variable attenuator comprises a plurality of attenuator stages connected in series along a transmission line. Each attenuator stage rapidly inserts or removes an attenuating pad in the signal path to selectively increase or decrease attenuation along the transmission line. First and second Loran signals may thus be alternately applied to the attenuator with the amount of attenuation being changed between each signal such that each signal is attenuated differently by selected amounts. The variable attenuator therefore allows each signal to be attenuated differently but by requiring each signal to pass over the same transmission line, the delay or distortion of each signal is substantially the same.

According to another aspect of the invention, in each stage of the attenuator a series connected impedance element of the pad, suitably a resistive pi-section of the transmission line, is selectively added or removed from the signal path by opening or closing a parallel connected switching device, while shunt connected elements of the pad are selectively connected or disconnected from ground by closing or opening a corresponding switching device.

According to a further aspect of the invention, the switching devices each comprise an NPN and a PNP bipolar transistor, the emitter of each transistor being coupled to the emitter of the other and the collector of each transistor being connected to the collector of the other, thereby providing a low impedance AC signal path from collector to emitter when the transistors are active.

It is accordingly an object of the present invention to provide a new and improved attenuator capable of rapidly varying signal attenuation.

It is another object of the invention to provide a new and improved apparatus for switching impedance elements in and out of a signal path.

It is a further object of the invention to provide a new and improved method for differently attenuating each of a pair of signals without substantially changing the phase angle between the signals.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a schematic diagram of a portion of one stage of a variable attenuator according to the present invention;

FIG. 2 is a schematic diagram of one stage of a variable attenuator according to the present invention.

DETAILED DESCRIPTION

Figure 3:
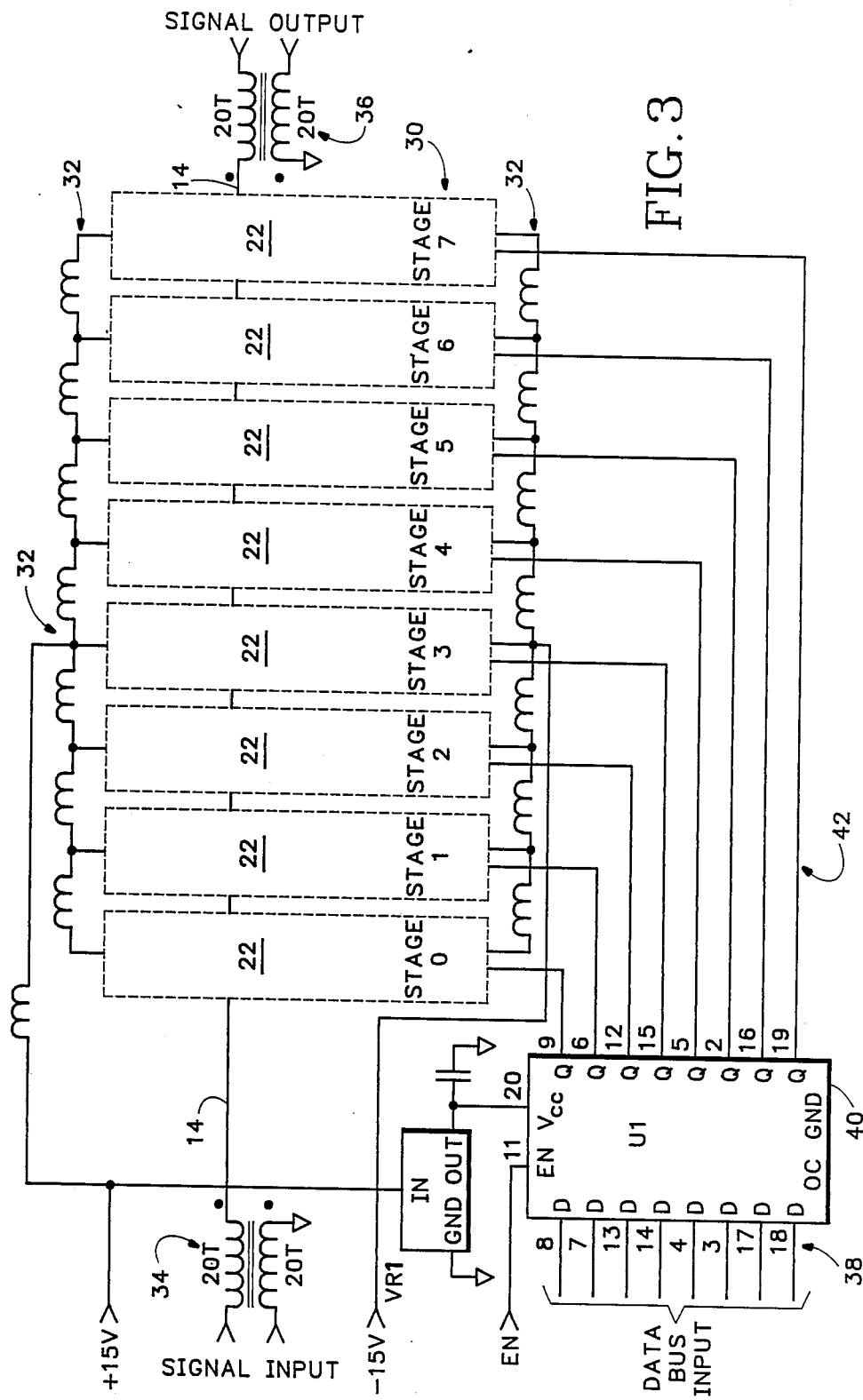
FIG. 3 is a block diagram of a multiple stage variable attenuator according to the present invention.

Referring to FIG. 1, a portion 10 of one stage of a variable attenuator according to the present invention, depicted in schematic diagram form, is adapted to selectively insert a resistive pi-section pad 12, comprising resistors RA, RB, and RC, into a 50 Ohm transmission line 14, thereby attenuating a signal passing over transmission line 14 by a selected amount. Resistor RB comprises a section of transmission line 14. A first end of resistor RA is connected to one end of resistor RB while a first end of resistor RC is connected to the remaining end of resistor RB. A pair 16 of transistors, comprising an NPN transistor Q8 and a PNP transistor Q9, coupled in back-to-back relation with collectors and emitters interconnected, is inserted in transmission line 14 with the emitter-to-collector path of the transistor pair 16 in parallel with resistor RB. A second transistor pair 18 comprises an NPN transistor Q6 and a PNP transistor Q7, also connected in back-to-back relation with collectors linked to a second end of resistor RA. The emitters of transistor pair 18 are grounded. A third transistor pair 20, comprising an NPN transistor Q10 and a PNP transistor Q11, also connected in back-to-back relation, have their collectors linked to a second end of resistor RC. The emitters of transistor pair 20 are also grounded.

When a signal traveling along transmission line 14 is not to be attenuated, transistors Q8 and Q9 are switched on, while transistors Q6, Q7, Q10 and transistor Q11 are switched off. With transistors Q8 and Q9 on, the input signal is shunted around resistor RB by transistors Q8 and Q9 and is not attenuated by RB. With transistor Q6, Q7, Q10, and Q11 off, resistor RA and resistor RC are uncoupled from ground and therefore they do not shunt any of the signal on transmission line 14 to ground. Thus resistor pad 12 is transparent to the signal on line 14 and does not cause signal attenuation.

When attenuation of a signal in transmission line 14 is desired, transistors Q8 and Q9 are turned off while transistors Q6, Q7, Q10, and Q11 are turned on. The signal must now pass through series resistor RB, since resistor RB is no longer shunted by transistors Q7 and Q8. Also, since resistors RA and RC are now grounded by transistor pairs 18 and 20, resistor pad 12 is no longer transparent and causes attenuation of any signal passing over the transmission line. Resistors RA, RB and RC of pad 12 are sized to provide a 50 ohm impedance match to transmission line 14 and to provide a selected amount of attenuation as described in more detail hereinbelow.

Use of bipolar transistors in pair 16 is preferable over use of field effect transistors because bipolar transistors have a much lower on state impedance, typically less than an Ohm as compared to 10–20 ohms for a typical FET, and therefore results in much less signal attenuation. The back-to-back arrangement of PNP and NPN transistors helps to cancel harmonic distortion of the signal and provides low impedance paths for AC signals. When the signal is in a positive voltage swing, the NPN transistor is active and when the signal is in a negative voltage swing, the PNP transistor is active.

Referring to FIG. 2, one stage 22 of a variable attenuator according to the present invention, depicted in schematic diagram form, includes additional circuitry adapted to synchronize the switching of transistor pairs 16, 18, and 20. When the pad 12 is to be inserted into the signal path, a 0 volt control signal is applied to the base of an NPN transistor Q4. The collector of transistor Q4 is connected to a +15 volt power supply through a pair of series connected resistors R1 and R2 while the emitter of transistor Q4 is coupled through a resistor R9 to the emitter of a PNP transistor Q5. The base of transistor Q5 is grounded while the collector of transistor Q5 is connected to a −15 volt supply through resistors R18 and R19 also connected in series. When the 0 volt control signal is applied to transistor Q4, transistor Q4 turns off, shutting off the current supply to transistor Q5, thereby turning transistor Q5 off. The collector of transistor Q4 is also connected to the base of a PNP transistor Q3 while the emitter of transistor Q3 is coupled through a variable resistor R6 in series with a resistor R5 to the +15 volt power supply. The collector of transistor Q3 is tied to a −15 volt power supply through a resistor R7, to the cathode of a diode CR1, and to the base of transistor Q8. The anode of diode CR1 is grounded through a resistor R8 and a parallel connected capacitor C2. When transistor Q4 turns off, its collector voltage and the transistor Q3 base voltage are pulled up by the +15 volt power supply, thereby turning transistor Q3 off. With transistor Q3 off, current is drawn from ground through resistor R8, diode CR1 and resistor R7 by the −15 v power supply. Resistors R7 and R8 comprise a voltage divider which causes the base of transistor Q8 to drop to about −5 V, reverse biasing the emitter-base junction of transistor Q8.

The collector of transistor Q5 is also connected to the base of an NPN transistor Q14. The emitter of transistor Q14 is coupled through a resistor R22 to the −15 volt power supply while the collector of transistor Q14 is coupled to a +15 volt power supply through a resistor R21; to the anode of a diode CR3; and to the base of transistor Q9. The cathode of diode CR3 is grounded through a resistor R23 and a parallel connected capacitor C5. When transistor Q5 turns off, following application of the 0 volt control signal to the base of transistor Q4, the transistor Q5 collector voltage and the transistor Q14 base voltage are pulled down by the −15 volt power supply, thereby turning transistor Q14 off. With transistor Q14 off, current is diverted to ground from the +15 v power supply through resistor R21, diode CR3, and resistor R23. Resistors R21 and R23 comprise a voltage divider which causes the base of transistor Q9 to rise to about +5 V, thereby reverse biasing the emitter-base junction of transistor Q9.

When transistor Q8 is off, diode CR1 couples the base of transistor Q8 to ground through resistor R8 and capacitor C2 to minimize capacitive coupling across transistor Q8. Similarly, when transistor Q9 is off, diode CR3 couples the base of transistor Q9 to ground through resistor R23 and capacitor C5 to minimize capacitive coupling across transistor Q9.

The base of an NPN transistor Q12 is connected to the junction between resistor R18 and resistor R19 while the base of a PNP transistor Q1 is connected to the junction between resistor R1 and resistor R2. The collectors of transistor Q1 and transistor Q12 are linked by a resistor R3. The collector of transistor Q1 is also connected to the base of a PNP transistor Q2 and the collector of transistor Q12 is also attached to the base of an NPN transistor Q13. The +15 volt power supply is applied to the emitters of transistors Q1 and Q2, while the −15 volt power supply is connected to the emitters of transistor Q12 and transistor Q13. The −15 volt power supply is applied to the collector of transistor Q2 through a resistor R4 with the +15 volt power supply being applied to the collector of transistor Q13 through a resistor R20.

The collector of transistor Q2 is also connected to the cathode of a diode CR2, to the base of transistor Q6 through a resistor R11, and to the base of transistor Q10 through a resistor R15. The anode of diode CR2 is coupled to the junction between diode CR1 and resistor R8. Similarly, the collector of transistor Q13 is connected to the anode of a diode CR4; to the base of transistor Q7 through a resistor R14; and to the base of transistor Q11 through a resistor R17. The cathode of diode CR4 is attached to the junction between diode CR3 and resistor R23.

When transistors Q4 and Q5 turn off, the base of transistor Q12 is pulled down by the −15 V power supply, turning off transistor Q12, and the base of the transistor Q1 rises to +15 V, turning off transistor Q1. Current passing through R3 from the base of transistor Q2 and into the base of transistor Q13 causes transistors Q2 and Q13 to saturate. When transistor Q2 saturates, current passes through transistor Q2 and resistor R11 and into the base of transistor Q6, causing the base of transistor Q6 to rise, turning on the transistor. At the same time, current passing through transistor Q2 and resistor R15 and into the base of transistor Q10, causes the base of transistor Q10 also to rise, turning on transistor Q10. Similarly, when transistor Q13 turns on, current passing through transistor Q13 from the bases of transistors Q7 and Q11 by way of resistors R14 and R17 causes the voltages at the bases of transistors Q7 and Q11 to fall, turning on both transistors.

Thus when a 0 volt control signal is applied to the base of transistor Q4, transistors Q8 and Q9 turn off, while transistors Q6, Q7, Q10 and Q11 turn on, thereby inserting the attenuating pad 12 into the signal path of transmission line 14.

When the attenuating pad is removed from the signal path, a +5 V signal is applied to the base of transistor Q4, turning on transistors Q4 and Q5. The current drawn by transistors Q4 and Q5 causes a voltage drop across R1 and R2, pulling the base of transistor Q3 down, turning it on. With transistor Q3 on, it supplies a current to the base of transistor Q8, turning transistor Q8 on. The current drawn by transistors Q4 and Q5 also produces a voltage increase across resistors R18 and R19, thereby increasing the voltage appearing at the base of transistor Q14, turning transistor Q14 on. Transistor Q14 draws current from the base of transistor Q9, turning transistor Q9 on. With transistors Q8 and Q9 on, the series resistor RB of pad 12 is shunted.

The resistance of variable resistor R6 is adjusted so that the current supplied to the base of transistor Q8 is equal to the current drawn from the base of transistor Q9 whereby none of this current enters transmission line 14, as would produce distortion of a signal. The resistance of resistor R6 is most accurately set by monitoring the output of transmission line 14 at the moment of switching the pad 12 out of the signal path, and adjusting R6 to minimize any signal resulting from the switching operation.

When transistors Q4 and Q5 turn on, transistors Q1 and Q12 also turn on. With transistor Q1 on, the voltage at the base of transistor Q2 rises, turning transistor Q2 off. With transistor Q12 on, the voltage at the base of transistor Q13 falls, turning transistor Q13 off. As transistor Q2 turns off, the −15 v power supply draws current from ground through R8, CR2 and R4. R4 and R8 act as voltage dividers to pull the base voltages of transistors Q6 and Q10 down, turning them off. At the same time, as transistor Q13 turns off, current passes to ground from the +15 V source through resistor R20, diode CR4 and resistor R23, pulling the base voltages of transistors Q7 and Q11 up, turning these transistors off too. With transistors Q6, Q7, Q10, and Q11 off, shunt resistors RA and RC are isolated from ground and therefore do not attenuate the signal on transmission line 14.

When transistors Q6, Q7, Q10, and Q11 are off, diode CR2 and diode CR4 clamp the bases of transistors Q6, Q7, Q10, and Q11 to a voltage sufficient to maintain the transistors in the off state for signal voltage swings less than about 6 volts peak to peak.

The transistor pairs 16, 18 and 20 thus act in concert, to switch pad 12 in and out of the signal path, completing the switching process within a few tens of microseconds after a change in state of the control signal at the base of transistor Q4. The circuit of FIG. 2 is suitable for operation with input AC signal voltages of up to approximately 6 volts peak-to-peak.

To improve impedance matching characteristics in attenuator stages having a higher attenuation capability, a capacitor CA is connected across resistor RC to compensate for the small leakage capacitances of transistors Q8 and Q9, thereby preventing any resulting phase shift of the signal. Additionally, a resistor R10 shunting the input side of transmission line 14 to ground compensates for the small series resistances of transistor Q8 and Q9 to maintain a 50 ohm impedance match when transistors Q8 and Q9 are on.

FIG. 3 illustrates in block diagram form an eight stage variable attenuator 30 according to the present invention, adapted to selectively provide a wide range of signal attenuation. Each stage 22 of attenuator 30 is similar to the attenuator stage 22 depicted in FIG. 2. The signal to be attenuated is applied through a balun transformer 34 to the transmission line 14 input of the first attenuator stage 0. The transmission line output of stage 0 is connected to the input of the next stage 1. Successive stages are interconnected in the same manner while the transmission line 14 output of the last attenuator stage, stage 7, is applied to an input of another balun transformer 36. The output of transformer 36 comprises the attenuator 30 signal output. Balun transformers 34 and 36 isolate the attenuator 30 ground from the external chassis ground thereby reducing noise passed from the chassis to the board.

A +15 volt power supply and a −15 volt power supply are connected to each attenuator stage 22 through a set of chokes 32, interconnecting the power supply inputs of each stage. The chokes 32 pass the DC supply voltages while blocking passage of AC noise signals between stages.

An eight line data bus 38 is applied to input terminals of an eight channel buffer 40, each of the eight channel outputs of buffer 40 being applied as the control signal input to a separate attenuator stage 22. The +15 volt power supply is connected to a voltage regulator VR1 which produces a clean +5 volt power supply for buffer 40, and the outputs of buffer 40 are enabled by an externally generated enable signal EN. When the enable signal is asserted, buffer 40 places a +5 volt control signal on any attenuator stage control line 42 corresponding to an asserted data bus control line 38, thereby causing the associated attenuator stage 22 to remove its attenuation pad 12 from the transmission line 14 signal path. Buffer 40 maintains all other attenuator stage 22 control inputs at 0 volts so that these stages retain their attenuation pads in the signal path.

The resistors in the pad 12 of each stage, along with capacitor CA are typically sized as follows to provide the indicated stage attenuation:

| Stage | Atten. |     | RA    |     | RB    |     | RC    |     | CA   |
|-------|--------|-----|-------|-----|-------|-----|-------|-----|------|
| 0     | 1 db   |     | 866 Ohm |   | 6.65 Ohm | | 866 Ohm | | — pF |
| 1     | 2      |     | 432   |     | 12.7  |     | 432   |     | —    |
| 2     | 4      |     | 221   |     | 24.9  |     | 221   |     | —    |
| 3     | 8      |     | 118   |     | 54.9  |     | 118   |     | —    |
| 4     | 16     |     | 68.86 |     | 158   |     | 68.86 |     | —    |
| 5     | 32     |     | 52.33 |     | 1020  |     | 51.31 |     | 270  |
| 6     | 32     |     | 52.33 |     | 1020  |     | 51.31 |     | 270  |
| 7     | 32     |     | 52.33 |     | 1020  |     | 51.31 |     | 270  |

Thus, depending on which stages are switched to provide attenuation, the attenuator 30 can selectively provide signal attenuation of from approximately 0 to 127 db. It is preferable to utilize the latter stages when possible for attenuation, rather than the earlier stages, since the latter stages also attenuate noise generated in the earlier stages.

While a preferred embodiment of the present invention has been shown and described, it will be apparent to those skilled in the art that many changes and modifications may be made without departing from the invention in its broader aspects. For instance, while the preferred embodiment implements attenuator pad 12 as a pi-section, a tee-section pad could also be employed using similar switching mechanisms to selectively insert the legs of the pad into the signal path. The appended claims are therefore intended to cover all such changes and modifications as fall within the true spirit and scope of the invention.

I claim:

1. A variable attenuator for selectively attenuating an input signal in response to a control signal to produce an output signal, the input signal being provided across an input node and a reference node, the output signal appearing across an output node and said reference node, the variable attenuator comprising:
   a series impedance element directly connected between said input and output nodes;
   a shunt impedance element; and
   first and second switch means, said first switch means being connected between said input and output nodes, said second switch means and said shunt impedance element being connected in series between one of said input and output nodes and said reference node, each of said first and second switch means having an input terminal and an output terminal and selectively coupling its input and output terminals in response to the control signal, such that when said control signal is of a first level, said first switch means couples its input and output terminals through a high impedance path and said second switch means couples its input and output terminals through a low impedance path, the input signal being attenuated by said series and shunt impedance elements thereby to produce said output signal, and such that when said control signal is of a second level, said first switch means couples its input and output terminals through a path of low impedance and said second switch means couples its input and output terminals through a path of high impedance such that said input signal passes through said variable attenuator without substantial attenuation to provide said output signal, wherein at least one of said first and second switch means comprises an NPN bipolar transistor having a base, an emitter, and a collector and comprises a PNP bipolar transistor having a base, an emitter and a collector, the emitters of both transistors being directly interconnected, the collectors of both transistors being directly interconnected, and one such interconnection forming an input terminal and the other such interconnection forming an output terminal of said at least one of said first and second switch means, wherein said at least one of said first and second switch means further comprises first current source means for supplying a first current of a first magnitude into the base of said NPN bipolar transistor when the control signal is one of said first and second levels, and for supplying said first current of substantially zero magnitude into the base of said NPN bipolar transistor when the control signal is another of siad first and second levels, wherein said at least one of said first and second switch means further comprises second current source means for drawing a second current of a second magnitude from the base of said PNP bipolar transistor when the control signal is said one of said first and second levels, and for drawing said second current of substantially zero magnitude from the base of said PNP bipolar transistor when the control signal is said another of said first and second levels, and wherein one of said first and second current source means includes means permitting adjustment of one of said first and second magnitudes over a continuous range of magnitudes without affecting the other of said first and second magnitudes, said one of said first and second magnitudes being adjusted such that said first and second magnitudes are substantially equal.

2. The variable attenuator in accordance with claim 1 wherein said one of said first and second current source means comprises:

a voltage source;

a variable resistor; and third switch means responsive to said control signal, said third switch means and said variable resistor being connected in series between said voltage source and the base of one of said PNP and NPN bipolar transistors, such that said third switch means and said variable resistor conduct one of said first and second current between said voltage source and said base of said one of said PNP and NPN bipolar transistors only when said control signal is a particular one of said first and second levels, said variable resistor adjustably controlling the magnitude of said one of said first and second currents over said continuous range of magnitudes and being adjusted so that said first and second magnitudes are substantially equal.

3. A variable attenuator comprising a plurality of stages connected in series, each stage comprising a reference node, an input node and an output node, each stage selectively attenuating a stage input signal in response to a control signal to produce a stage output signal, the stage input signal being provided across the input node and the reference node, the output signal being provided across the output node and the reference node, each stage further comprising:

a series impedance element directly connected between said input and output nodes;

a shunt impedance element; and first and second switch means, said first switch means being connected between said input and output nodes, said second switch means and said shunt impedance element being connected in series between one of said input and output nodes and said reference node, each of said first and second switch means having an input terminal and an output terminal and selectively coupling its input and output terminals through high and low impedance paths in response to the control signal, wherein at least one of said first and second switch means comprises an NPN bipolar transistor having a base, an emitter, and a collector and a PNP bipolar transistor having a base, an emitter and a collector, the emitters of both transistors being directly interconnected, the collectors of both transistors being directly interconnected, and one such interconnection forming an input terminal and the other such interconnection forming an output terminal of said at least one of said first and second switch means, wherein said at least one of said first and second switch means further comprises first current source means for supplying a first current of a first magnitude into the base of said NPN bipolar transistor when the control signal is one of said first and second levels, and for supplying said first current of substantially zero magnitude into the base of said NPN bipolar transistor when the control signal is another of said first and second levels, wherein said at least one of said first and second switch means further comprises second current source means for drawing a second current of a second magnitude from the base of said PNP bipolar transistor when the control signal is said one of said first and second levels, and for drawing said second current of substantially zero magnitude from the base of said PNP bipolar transistor when the control signal is said another of said first and second levels, and wherein one of said first and second current source means includes means permitting adjustment of one of said first and second magnitudes over a continuous range of magnitudes without affecting the other of said first and second magnitudes, said one of said first and second magnitudes being adjusted such that said first and second magnitudes are substantially equal.

4. The variable attenuator in accordance with claim 3 wherein said one of said first and second current source means of at least one stage comprises:
   a voltage source;
   a variable resistor; and
   third switch means responsive to said control signal, said third switch means and said variable resistor being connected in series between said voltage source and the base of one of said PNP and NPN bipolar transistors, such that said third switch means and said variable resistor conduct one of said first and second currents between said voltage source and said base of said one of said PNP and NPN bipolar transistors only when said control signal is a particular one of said first and second levels, said variable resistor adjustably controlling the magnitude of said one of said first and second currents over said continuous range of magnitudes and being adjusted so that said first and second magnitudes are substantially equal.

* * * * *